(12) United States Patent
Inagaki et al.

(10) Patent No.: US 12,078,423 B2
(45) Date of Patent: Sep. 3, 2024

(54) VAPOR CHAMBER WITH MULTILAYER WICK

(71) Applicant: Furukawa Electric Co., Ltd., Tokyo (JP)

(72) Inventors: Yoshikatsu Inagaki, Tokyo (JP); Hirofumi Aoki, Tokyo (JP); Daiki Takemura, Tokyo (JP); Hiroshi Okada, Tokyo (JP); Kazuaki Aotani, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 17/103,854

(22) Filed: Nov. 24, 2020

(65) Prior Publication Data

US 2021/0095930 A1 Apr. 1, 2021

Related U.S. Application Data

(63) Continuation of application No. PCT/JP2019/019205, filed on May 15, 2019.

(30) Foreign Application Priority Data

May 29, 2018 (JP) ................................ 2018-102659

(51) Int. Cl.
  *F28D 15/00* (2006.01)
  *F28D 15/02* (2006.01)
  (Continued)

(52) U.S. Cl.
  CPC ....... *F28D 15/046* (2013.01); *F28D 15/0233* (2013.01); *H05K 7/20336* (2013.01)

(58) Field of Classification Search
  CPC .... F28D 15/04; F28D 15/046; F28D 15/0233; F28D 15/0266; H01L 23/427; H05K 7/20336
  See application file for complete search history.

(56) References Cited

U.S. PATENT DOCUMENTS

| 6,269,866 B1 * | 8/2001 | Yamamoto | F28D 15/0233 174/15.2 |
| 2002/0050341 A1 * | 5/2002 | Dussinger | F28D 15/0233 165/104.26 |

(Continued)

FOREIGN PATENT DOCUMENTS

| CN | 106813524 A | 6/2017 | |
| JP | 2005180871 | * 7/2005 | F28D 15/0233 |

(Continued)

OTHER PUBLICATIONS

English translation of International Preliminary Report on Patentability for Application No. PCT/JP2019/019205, dated Dec. 1, 2020.

(Continued)

*Primary Examiner* — Travis Ruby
(74) *Attorney, Agent, or Firm* — Dorsey & Whitney LLP (57) ABSTRACT

The vapor chamber includes a container having a hollow cavity and formed of one plate-shaped member and another plate-shaped member facing the one plate-shaped member that are layered on each other, a working fluid enclosed in the cavity, and a wick structure provided in the cavity. The wick structure includes a first wick part extending from a heat receiving part to a heat discharge part and having a first wick member using a linear member, and a second wick part provided to the heat receiving part and having a second wick member using a linear member. An average diameter the linear member of the second wick member is smaller than an average diameter of the linear member of the first wick member or an aperture dimension of the second wick member is smaller than an aperture dimension of the first wick member.

10 Claims, 5 Drawing Sheets

(51) Int. Cl.
  *F28D 15/04* (2006.01)
  *H05K 7/20* (2006.01)

(56) References Cited

U.S. PATENT DOCUMENTS

| | | | | |
|---|---|---|---|---|
| 2002/0189793 | A1* | 12/2002 | Noda | F28D 15/046 165/104.26 |
| 2006/0124280 | A1* | 6/2006 | Lee | F28D 15/046 257/E23.099 |
| 2007/0163755 | A1* | 7/2007 | Kim | H01L 23/427 165/104.21 |
| 2009/0294104 | A1* | 12/2009 | Lin | F28D 15/0233 165/104.26 |
| 2010/0139893 | A1* | 6/2010 | Ding | F28D 15/046 165/104.26 |
| 2010/0157533 | A1* | 6/2010 | Oniki | H05K 7/20336 29/890.032 |
| 2010/0307722 | A1* | 12/2010 | Ryoson | F28D 15/046 228/265 |
| 2011/0024085 | A1* | 2/2011 | Huang | F28D 15/0233 29/890.032 |
| 2013/0025829 | A1* | 1/2013 | Huang | F28D 15/0233 165/104.26 |
| 2014/0202665 | A1* | 7/2014 | Paschkewitz | H01L 23/427 165/104.26 |
| 2015/0013943 | A1* | 1/2015 | Inagaki | F28D 15/046 165/104.26 |
| 2015/0129177 | A1* | 5/2015 | Pai | F28D 15/046 165/104.26 |
| 2016/0018165 | A1* | 1/2016 | Ahamed | F28D 15/0233 165/104.26 |
| 2018/0306523 | A1* | 10/2018 | Sasaki | F28D 15/046 |

FOREIGN PATENT DOCUMENTS

| | | | |
|---|---|---|---|
| JP | 2005180871 A | 7/2005 | |
| JP | 2007519877 A | 7/2007 | |
| JP | 2018004108 A | 1/2018 | |
| TW | M299458 U | 10/2006 | |
| WO | WO-2017115771 A1 * | 7/2017 | F28D 15/0233 |
| WO | 2018003957 A1 | 1/2018 | |

OTHER PUBLICATIONS

English translation of International Search Report and Written Opinion for Application No. PCT/JP2019/019205, dated Jun. 11, 2019.

English translation of Notice of Reasons for Refusal for JP Application No. 2018-102659, dated May 27, 2019.

English translation of Office Action for TW Application No. 10920038430, dated Jan. 14, 2020.

English translation of Office Action for TW Application No. 10920495150, dated May 26, 2020.

\* cited by examiner

VAPOR CHAMBER WITH MULTILAYER WICK

CROSS REFERENCE TO RELATED APPLICATIONS

The present application is a continuation application of International Patent Application No. PCT/JP2019/019205 filed on May 15, 2019, which claims the benefit of Japanese Patent Application No. 2018-102659, filed on May 29, 2018. The contents of these applications are incorporated herein by reference in their entirety.

BACKGROUND

Technical Field

The present disclosure relates to a vapor chamber capable of preventing dry-out in a heat receiving part even if a cooling object of a large amount of heat generation is thermally connected and enabling a working fluid in a liquid phase to circulate smoothly from a heat discharge part to a hear receiving part.

BACKGROUND

In an electronic component such as a semiconductor element mounted on an electric/electronic device, the amount of heat generation increases due to high-density mounting or the like along with higher functionality. In recent years, cooling thereof has become more important. Moreover, the size of an electric/electronic device is reduced and the internal space of the electric/electronic device is narrowed, so that an electronic component such as a semiconductor device is mounted in the narrowed space. As a cooling method of an electronic component mounted in the narrowed space, a vapor chamber (heat pipe of a planar type) may be used.

As described above, since the amount of heat generation of a cooling object increases, it is important to prevent dry-out in the heat receiving part of the vapor chamber. As a means for preventing dry-cut, an attempt is made to improve capillarity of a wick structure. As a vapor chamber in which capillarity of the wick structure is improved, it is proposed to dispose, inside a container, a wick including a mesh-like member extending from a heat discharge part to a heat receiving part, and a sintered body of powder that is fixedly attached to the heat receiving part of the mesh-like member and that makes the capillarity in the heat receiving part higher than the capillarity in the heat discharge part (Japanese Patent Application Laid-Open No. 2018-4108 (Patent Literature 1)).

In Patent Literature 1, since the sintered body of powder is pressed to the inside of the mesh-like member, the capillarity of the wick in the heat receiving part is improved compared with the capillarity of the wick in the heat discharge part. As a result dry-out of the vapor chamber is prevented.

In Patent Literature 1, in manufacturing a wick, it is necessary to perform a heating process for sintering powder applied to the mesh-like member. Meanwhile, a wick may also function as a support member for maintaining the space inside the container to which decompression processing has been applied. However, as in Patent Literature 1, when the mesh-like member forming the wick is loaded with heat, the mechanical strength of the wick may be lowered due to the thermal effect, so that the function as a support member may not be obtained sufficiently. Moreover, when a heating process is performed to sinter powder after the powder is contained in the container, the mechanical strength of the container may be lowered due to the thermal effect.

In view of the above situation an object of the present disclosure is to provide a vapor chamber that is excellent in mechanical strength, that is capable of preventing dry-out in a heat receiving part even if a cooling object having a large amount of heat generation is thermally connected, and that enables a working fluid in a liquid phase to circulate smoothly from a heat discharge part to a hear receiving part.

SUMMARY

Outlines of the components of the present disclosure are as follows

[1] A vapor chamber comprising:
 a container having a cavity that is hollow, the container being formed of one plate-shaped member and another plate-shaped member facing the one plate-shaped member, the one plate-shaped member and the other plate-shaped member being layered on each other;
 a working fluid enclosed in the cavity; and
 a wick structure provided in the cavity, wherein
 the wick structure includes a first wick part extending from a heat receiving part to a heat discharge part and having a first wick member using a linear member, and a second wick part provided to the heat receiving part and having a second wick member using a linear member, and
 an average diameter of the linear member of the second wick member is smaller than an average diameter of the linear member of the first wick member, or
 an aperture dimension of the second wick member is smaller than an aperture dimension of the first wick member.

[2] The vapor chamber according to [1], wherein the second wick part is layered on the first wick part.

[3] The vapor chamber according to [1] or [2], wherein a plurality of the second wick members are layered on each other to form the second wick part.

[4] The vapor chamber according to any one of [1] to [3], wherein an area of the second wick part in a plan view is larger by 2% or more and 60% or less than an area in a plan view of a cooling object that is thermally connected to the heat receiving part.

[5] The vapor chamber according to any one of [1] to [4], wherein the average diameter of the linear member of the second wick member is smaller by 30% or more and 70% or less than the average diameter of the linear member of the first wick member.

[6] The vapor chamber according to any one of [1] to [5], wherein the aperture dimension of the second wick member is smaller by 20% or more and 70% or less than the aperture dimension of the first wick member.

[7] The vapor chamber according to any one of [1] to [6], wherein each of the first wick member and the second wick member is a metal mesh.

[8] A heat sink comprising:
 a vapor chamber; and
 a heat discharge fin thermally connected to a heat discharge part of the vapor chamber, wherein
 the vapor chamber includes:
 a container having a cavity that is hollow, the container being formed of one plate-shaped member and another plate-shaped member facing the one plate-shaped member, the one plate-shaped member and the other plate-shaped member being layered on each other;

a working fluid enclosed in the cavity; and a wick structure provided in the cavity, the wick structure includes a first wick part extending from the heat receiving part to a heat discharge part and having a first wick member using a linear member, and a second wick part provided to the heat receiving part and having a second wick member using a linear member, and an average diameter of the linear member of the second wick member is smaller than an average diameter of the linear member of the first wick member, or an aperture dimension of the second wick member is smaller than an aperture dimension of the first wick member.

In the vapor chamber of [1], a portion located at the heat receiving part in the wick structure is provided with the first wick part and the second wick part. The heat receiving part is a region to which a heat source that is a cooling object is thermally connected and which receives heat from the cooling object. The heat discharge part is a portion that corresponds to the circumference of the heat receiving part and in which a working fluid in a gas phase is changed into a liquid phase and latent heat is discharged.

In the vapor chamber of [2], a portion located at the heat receiving part in the wick structure has a layered structure of the second wick part and the first wick part.

In the vapor chamber of [4], since the area of the second wick part in a plan view is larger than the area of the cooling object in a plan view, the second wick part has a portion extending to the outside of the cooling object in a plan view. Note that a "plan view" in the present specification means a state where a view is made from the vertical direction with respect to the main surface of the container.

According to an aspect of the vapor chamber of the present disclosure, the average diameter of the linear member of the second wick member is smaller than that of the linear member of the first wick member, or the aperture dimension of the second wick member is smaller than that of the first wick member, so that the second wick part generates larger capillarity than that of the first wick part. Moreover, since the wick structure has the first wick part extending from the heat receiving part to the heat discharge part and the second wick part provided to the heat receiving part, the heat receiving part is provided with not only the first wick part but also the second wick part that generates larger capillarity. Accordingly, since the wick structure in the heat receiving part generates excellent capillarity, even if a cooling object having a large amount of heat generation is thermally connected, the working fluid in a liquid phase reliably circulates from the heat discharge part to the hear receiving part, whereby dry-out in the heat receiving part can be prevented.

On the other hand, since the average diameter of the linear member of the first wick member is larger than that of the linear member of the second wick member, or the aperture dimension of the first wick member is larger than that of the second wick member, the first wick part has a smaller flow path resistance to the working fluid than that of the second wick part. Moreover, since the wick structure has a structure in which the first wick part extends from the heat receiving part to the heat discharge part and the second wick part is provided to the heat receiving part, the heat discharge part is provided with the first wick part in which the flow path resistance to the working fluid is small, but it is not provided with the second wick part. Accordingly, the working fluid in a liquid phase can smoothly circulate from the heat discharge part to the heat receiving part. Therefore according to an aspect of the vapor chamber of the present disclosure, an excellent heat transportation property can be exhibited.

Further, according to an aspect of the vapor chamber of the present disclosure, a sintered body of powder is not needed to be used as a material of the wick structure. This can prevent deterioration of the mechanical strength of the container and the wick structure that may be caused by the thermal effect.

According to an aspect of the vapor chamber of the present disclosure, since the second wick part is layered on the first wick part, connectivity between the second wick part and the first wick part is improved, and the capillarity of the wick structure in the heat receiving part can be further improved.

According to an aspect of the vapor chamber of the present disclosure, since a plurality of second wick members are layered to form the second wick part, the capillarity of the wick structure in the heat receiving part can be further improved.

DETAILED DESCRIPTION

Figure 1:
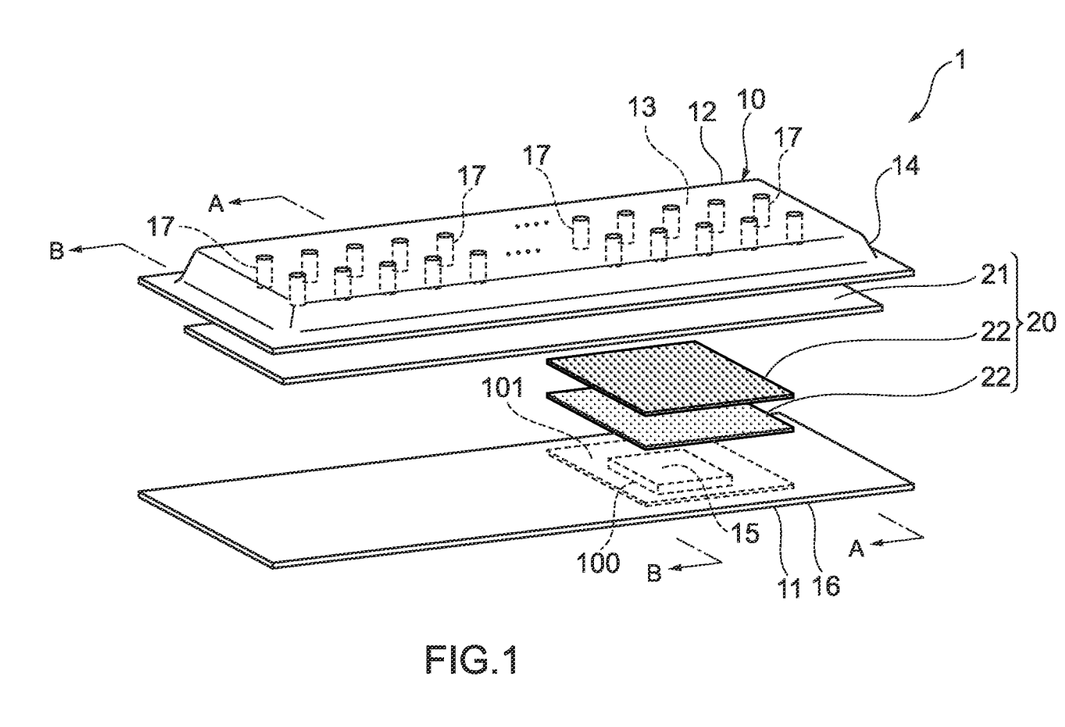
FIG. 1 is an exploded perspective view of a vapor chamber according to a first exemplary embodiment of the present disclosure.
Figure 2:
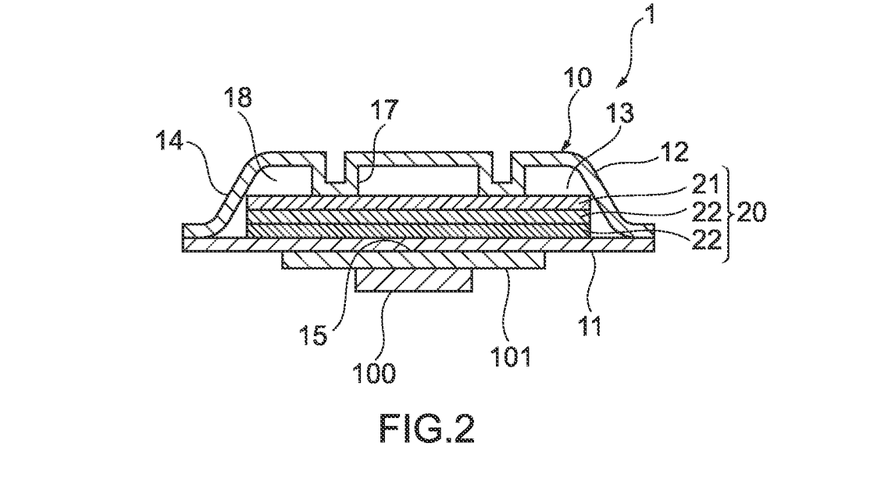
FIG. 2 is an A-A sectional view of the vapor chamber in FIG. 1.
Figure 3:
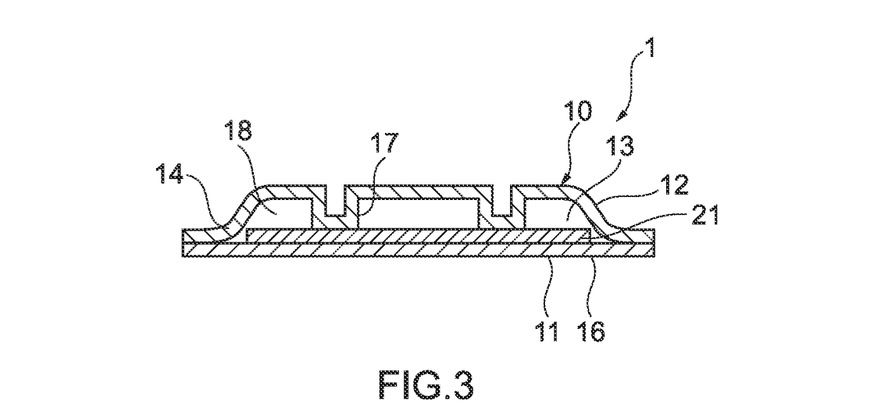
FIG. 3 is a B-B sectional view of the vapor chamber in FIG. 1.
Figure 4:
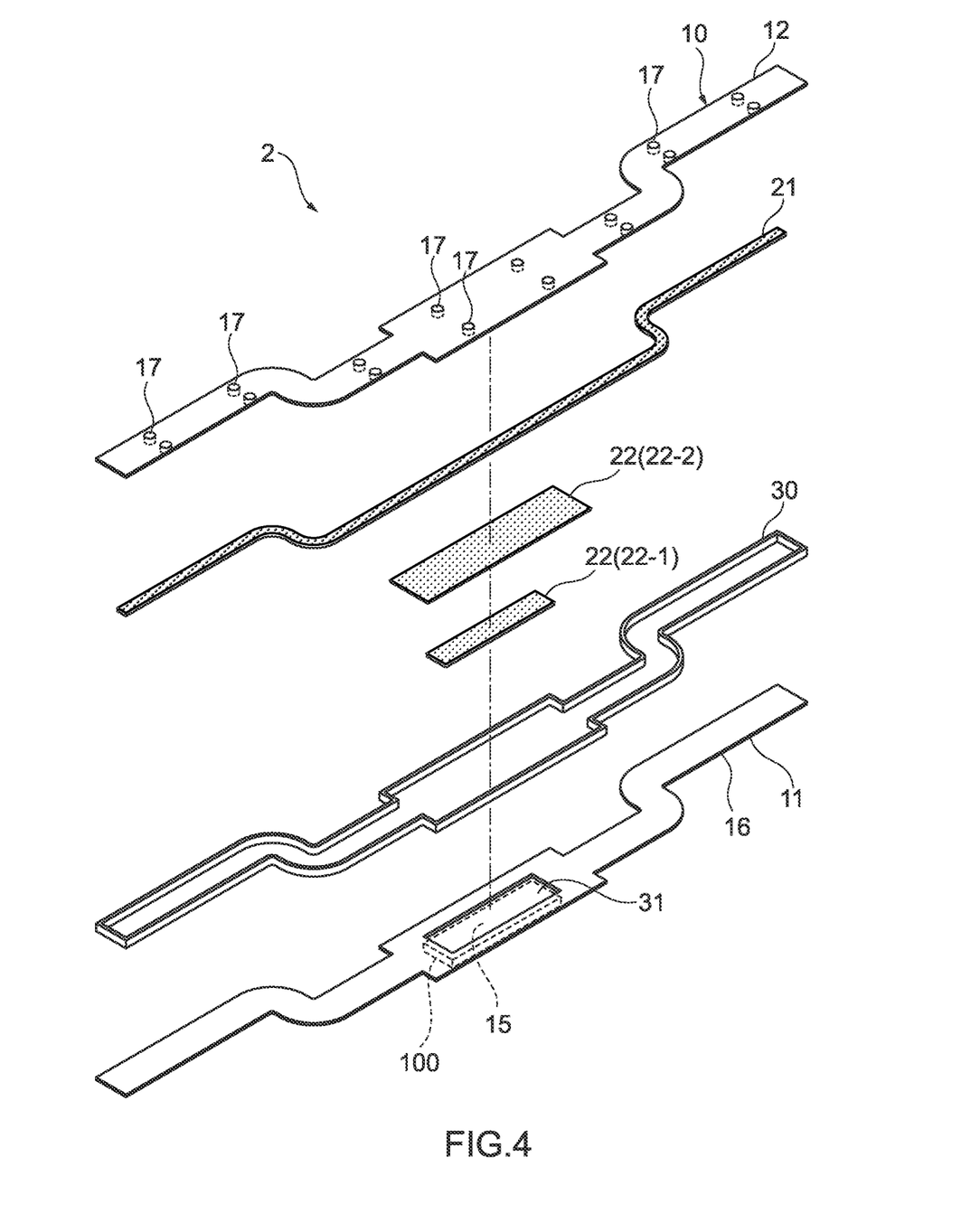
FIG. 4 is an exploded perspective view of a vapor chamber according to a second exemplary embodiment of the present disclosure.
Figure 5:
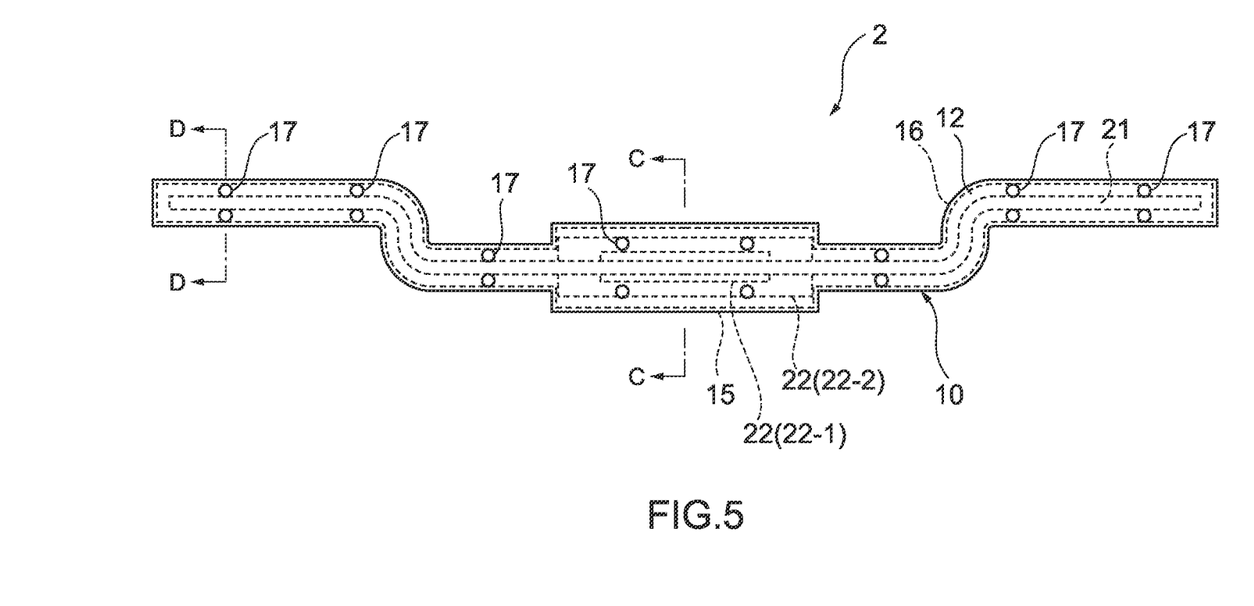
FIG. 5 is an explanatory view illustrating the overview from a planar direction of the vapor chamber according to the second exemplary embodiment of the present disclosure.
Figure 6:
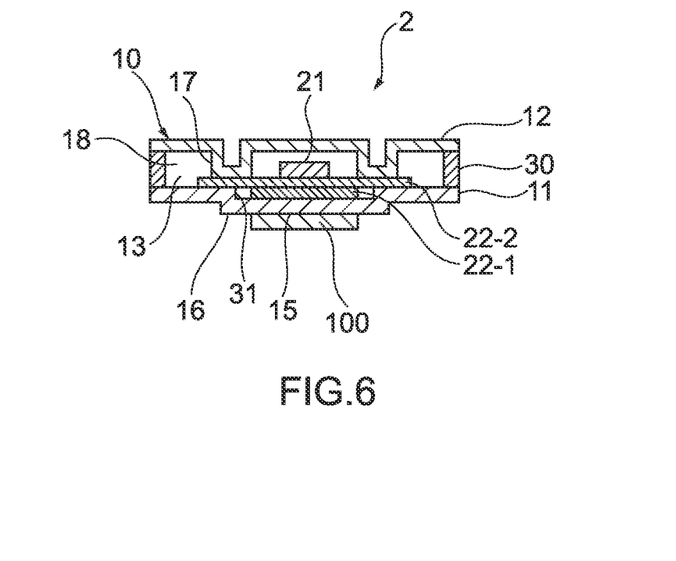
FIG. 6 is a C-C sectional view of the vapor chamber in FIG. 5.
Figure 7:
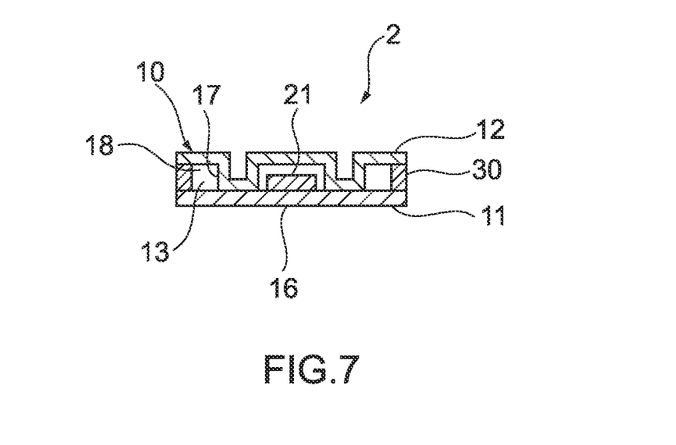
FIG. 7 is a D-D sectional view of the vapor chamber in FIG. 5.

Hereinafter, a vapor chamber according to a first exemplary embodiment of the present disclosure will be described with reference to the drawings. FIG. 1 is an exploded perspective view of a vapor chamber according to the first exemplary embodiment of the present disclosure. FIG. 2 is an A-A sectional view of the vapor chamber in FIG. 1. FIG. 3 is a B-B sectional view of the vapor chamber in FIG. 1. FIG. 4 is an exploded perspective view of a vapor chamber according to a second exemplary embodiment of the present disclosure. FIG. 5 is an explanatory view illustrating the overview from a planar direction of the vapor chamber according to the second exemplary embodiment of the present disclosure. FIG. 6 is a C-C sectional view of the vapor chamber in FIG. 5. FIG. 7 is a D-D sectional view of the vapor chamber in FIG. 5.

As illustrated in FIGS. 1 to 3, a vapor chamber 1 according to the first exemplary embodiment of the present disclosure includes a container 10, having a rectangular shape in a planar view, in which a cavity 13 is formed by overlapping two opposing plate-shaped members, that is, one plate-shaped member 11 and another plate-shaped member 12 facing the one plate-shaped member 11, and a working fluid (not illustrated) enclosed in the cavity 13. In the internal space of the cavity 13, a wick structure 20 that generates capillarity is also contained. Moreover, a space between the inner surface of the other plate-shaped member 12 and the wick structure 20 forms a steam flow path 18 through which a working fluid in a gas phase flows.

The one plate-shaped member 11 is in a plate shape. The other plate-shaped member 12 is also in a plate shape, but a center portion and the vicinity thereof are plastically deformed in a protruding shape. A portion of the other plate-shaped member 12, protruding toward the outside and plastically deformed in a protruding shape, is a protruding part 14 of the container 10, and the inside of the protruding part 14 forms the cavity 13. The cavity 13 is decompressed by deaeration. The container 10 is in a planar shape. A direction along the plane of the container 10 is a heat transportation direction of the vapor chamber 1.

The wick structure 20 includes a first wick part 21 and a second wick part 22. The first wick part 21 extends all over the cavity 13 along the planar direction of the container 10. Accordingly, the first wick part 21 extends from a heat receiving part 15 to a heat discharge part 16 of the container 10. The first wick part 21 is formed of a first wick member using a linear member that is an almost sheet-shaped member. Accordingly, the first wick part 21 is in an almost sheet shape. Examples of the first wick member using a linear member include a wick member using metal wires such as a metal mesh, a braided body of metal wires, or a stranded wire of metal wires, and a mesh-like member using linear carbon. Moreover, as the metal type of metal wires, examples include copper, copper alloy aluminum, aluminum alloy, titanium, titanium alloy, stainless steel, and the like.

This means that a sintered body of metal powder is not used as the first wick member. In the wick structure 20, a metal mesh is used as the first wick member.

The thickness of the first wick part 21 is not particularly limited, and is selectable according to the dimension in the thickness direction of the cavity 13. For example, the thickness may range from 0.05 mm to 0.20 mm. Also, the number of layers of the first wick members is not particularly limited. The first wick part 21 is formed of one first wick member.

As illustrated in FIGS. 1 and 2, the second wick part 22 is disposed at the heat receiving part 15 of the container 10 along the planar direction of the container 10. The second wick part 22 is layered on the first wick part 21 in an overlapping manner. In the vapor chamber 1, the second wick part 22 is layered so as to be located on a side to which a cooling object 100 is thermally connected. Since the second wick part 22 forms a layer structure with the first wick part 21, connectivity between the second wick part 22 and the first wick part 21 is improved, and the capillarity of the wick structure 20 in the heat receiving part 15 can be improved reliably.

The second wick part 22 is formed of a second wick member using a linear member that is an almost sheet-shaped member. Accordingly, the second wick part 22 is in an almost sheet shape. Further, the dimension in the width direction of the second wick part 22 is almost the same as the dimension in the width direction of the first wick part 21. Examples of the second wick member using a linear member include a wick member using metal wires such as a metal mesh, a braided body of metal wires, and a stranded wire of metal wires, and a mesh-like member using linear carbon. Moreover, as the metal type of metal wires, examples include copper, copper alloy, aluminum, aluminum alloy, titanium, titanium alloy, stainless steel, and the like.

This means that a sintered body of metal powder is not used as the second wick member. In the wick structure 20, a metal mesh is used as the second wick member.

The thickness of the second wick part 22 is not particularly limited, and is selectable according to the dimension in the thickness direction of the cavity 13. For example, the thickness may range from 0.025 mm to 0.10 mm.

On the other hand, the second wick part 22 is not disposed on the heat discharge part 16 that corresponds to a portion other than the heat receiving part 15 of the container 10. Accordingly, as illustrated in FIG. 2, in the wick structure 20, the portion corresponding to the heat receiving part 15 has a structure in which the first wick part 21 and the second wick part 22 are layered on each other, and as illustrated in FIG. 3, the portion corresponding to the heat discharge part 16 has a structure in which only the first wick part 21 is disposed and the second wick part 22 is not disposed.

The second wick part 22 may be formed of one second wick member, or may be formed of a plurality of second wick members that are layered on each other. Since the second wick part 22 is formed of a plurality of second wick members that are layered on each other, the capillarity of the wick structure 20 in the heat receiving part 15 can be improved reliably. Note that as illustrated in FIGS. 1 and 2, in the vapor chamber 1, two second wick members are layered to form the second wick part 22.

The wick structure 20 has an aspect that an average diameter of the linear member such as a metal wire of the second wick member is smaller than the average diameter of the linear member such as a metal wire of the first wick member, or the aperture dimension of the second wick member is smaller than the aperture dimension of the first wick member. Accordingly, the capillarity of the second wick part 22 is larger than the capillarity of the first wick part 21. Moreover, the flow path resistance to the working fluid of the first wick part 21 is smaller than the flow path resistance to the working fluid of the second wick part 22. Accordingly, in the wick structure 20 extending all over the cavity 13, larger capillarity is generated in the area located at the heat receiving part 15 than in the area located at the heat discharge part 16. Therefore, even if the cooling object 100 having a large amount of heat generation is thermally connected to the container 10, the working fluid in a liquid phase reliably circulates from the heat discharge part 16 to the hear receiving part 15, whereby dry-out in the heat receiving part 15 can be prevented. Moreover, in the wick structure 20, the area located at the heat discharge part 16 where only the first wick part 21 is disposed has small flow path resistance to the working fluid, compared with that in the area located at the heat receiving part 15 where the first wick part 21 and the second wick part 22 are disposed. Therefore, the working fluid changed from a gas phase to a liquid phase in the heat discharge part 16 can smoothly circulate from the heat discharge part 16 to the heat receiving part 15. Therefore, in the vapor chamber 1, an excellent heat transportation property can be exhibited.

Moreover, since the shape of the vapor chamber 1 is a thin planar shape, the mechanical strength is required. As a sintered body of metallic powder is not used as the first wick member and the second wick member, it is possible to prevent degradation of the mechanical strength of the container 10 and the wick structure 20 that may be caused by a thermal effect in the sintering process of metallic powder.

The average diameter (wire diameter) of the linear member such as a metal wire of the second wick member is not particularly limited if it is smaller than the average diameter (wire diameter) of the linear member such as a metal wire of the first wick member. For example, from the point of reliably reducing the flow path resistance of the wick structure 20 located at the heat discharge part 16 while further improving the capillarity of the wick structure 20 located at the heat receiving part 15, it is preferable that the average diameter of the linear member such as a metal wire of the second wick member ranges from 30% to 70% inclusive of the average diameter of the linear member such as a metal wire of the first wick member, and it is particularly preferable that the average diameter thereof ranges from 40% to 60% inclusive.

The average diameter of the linear member such as a metal wire of the first wick member that is a metal mesh is not particularly limited. However, from the point of reliably reducing the flow path resistance, for example, it is preferable that the average diameter is between 30 μm and 80 μm, and it is particularly preferable that the average diameter is between 40 and 60 μm. The average diameter of the linear member such as a metal wire of the second wick member that is a metal mesh is not particularly limited. However, from the point of reliably further improving the capillarity, for example, it is preferable that the average diameter is between 20 μm and 40 μm, and it is particularly preferable that the average diameter is between 25 μm and 35 μm.

The aperture dimension of the second wick member is not particularly limited if it is smaller than the aperture dimension of the first wick member. For example, from the point of reliably reducing the flow path resistance of the wick structure 20 located at the heat discharge part 16 while further improving the capillarity of the wick structure 20 located at the heat receiving part 15, it is preferable that the aperture dimension of the second wick member ranges from 20% to 70% inclusive of the aperture dimension of the first wick member, and it is particularly preferable that the aperture dimension of the second wick member ranges from 25% to 60% inclusive.

Moreover, the aperture dimension of the first wick member that is a metal mesh is not particularly limited. However, from the point of reliably reducing the flow path resistance, for example, it is preferable that the aperture dimension is between 0.034 mm and 0.132 mm, and it is particularly preferable that the aperture dimension is between 0.045 mm and 0.109 mm. Moreover, the aperture dimension of the second wick member that is a metal mesh is not particularly limited. However, from the point of further improving the capillarity, for example, it is preferable that the aperture dimension is between 0.020 mm to 0.062 mm, and it is particularly preferable that the aperture dimension is between 0.026 mm and 0.043 mm.

It is preferable that the aperture ratio of the second wick member is smaller than the aperture ratio of the first wick member. For example, from the point of reliably reducing the flow path resistance of the wick structure 20 located at the heat discharge part 16 while further improving the capillarity of the wick structure 20 located at the heat receiving part 15, it is preferable that the aperture ratio of the second wick member ranges from 30% to 70% inclusive of the aperture ratio of the first wick member, and it is particularly preferable that the aperture ratio of the second wick member ranges from 0% to 60% inclusive.

Moreover, the aperture ratio of the first wick member that is a metal mesh is not particularly limited. However, from the point of reliably reducing the flow path resistance, for example, it is preferable that the aperture ratio is between 27.8% and 41.7%. Moreover, the aperture ratio of the second wick member that is a metal mesh is not particularly limited. However, from the point of further improving the capillarity, for example, it is preferable that the aperture ratio is between 25.0% and 36.8%, and it is particularly preferable that the aperture ratio is between 25.8% and 30.5%.

As illustrated in FIG. 1, in the vapor chamber 1, the second wick part 22 is disposed so as to overlap the entire cooling object 100 in a plan view. Moreover, it is preferable that the area of the second wick part 22 in a plan view is larger than the area of the cooling object 100 thermally connected to the heat receiving part 15 in a plan view. Specifically, for example, from the point of allowing a working fluid in a liquid phase having a sufficient amount to circulate all over the heat receiving part 15, it is preferable that the area of the second wick part 22 in a plan view is larger than the area of the cooling object 100 in a plan view by 2% or more and 60% or less, and it is particularly preferable that the area of the second wick part 22 is larger by 15% or more and 30% or less.

As illustrated in FIGS. 1 to 3, on an inner surface of the other plate-shaped member 12 corresponding to the cavity 13, a plurality of post members 17 are provided in a protruding manner. The post member 17 extends from the other plate-shaped member 12 to the one plate-shaped member 11, and the tip of the post member 17 contacts the wick structure 20. The post member 17 has a function of maintaining the internal space of the cavity 13 that is decompressed. Examples of the post member 17 include a post formed by performing punching on the other plate-shaped member 12, a post formed by performing etching on the inner surface of the other plate-shaped member 12, a post in a boss shape formed by press-molding the other plate-shaped member 12, a post obtained by molding a mesh member such as a metal mesh, a post formed of a sintered body of metal powder or metallic short fiber, a metal member in a rod shape, and the like.

As a material of the container 10, examples include metal such as copper, copper alloy, aluminum, aluminum alloy, nickel, nickel alloy, stainless steel, and titanium, one in which metallic foil is coated with resin, and the like. As a metal type of the metallic foil, metal that can be used in the container 10 may be named. The thickness of the vapor chamber 1 is not particularly limited. As an example, the thickness may be between 0.5 mm and 1.0 mm substantially. The thicknesses of the one plate-shaped member 11 and the other plate-shaped member 12 are selectable as appropriate, according to the used conditions and the like. As an example, the thickness of each of them may be about 0.1 mm.

Moreover, in the periphery of the container 10, the one plate-shaped member U and the other plate-shaped member 12 overlap each other in a contact state. When the peripheries of the one plate-shaped member 11 and the other plate-shaped member 12 are joined each other, the container 10 in which the internal space is sealed is formed. The joining method is not particularly limited. Examples thereof include diffusion bonding, brazing, laser welding, ultrasonic welding, friction joining, press joining, and the like. The joint width may be between 0.3 mm and 2.5 mm, for example.

A method of fixing the second wick part 22 to the first wick part 21 (thermal connection method) and a method of fixing the second wick parts 22 to each other (thermal connection method) are not particularly limited. For example, a welding means such as resistance welding may be used. Moreover, the wick structure 20 may be fixed to the container 10 (thermal connection). As a fixing method, a welding means such as resistance welding may be used.

The working fluid to be enclosed in the cavity 13 is selectable as appropriate, according to the compatibility with the material of the container 10. Examples thereof include water, alternative fluorocarbon, fluorocarbon, cyclopentane, ethylene glycol, and the like.

Next, operation of the vapor chamber 1 according to the first exemplary embodiment of the present disclosure will be described with reference to the FIGS. 1 to 3. In the vapor chamber 1, a portion thermally connected to a heating element that is the cooling object 100 functions as the heat receiving part 15. In the vapor chamber 1, for example, the vapor chamber 1 and the cooling object 100 are thermally connected to each other via a heat receiving plate 101 between the cooling object 100 and the container 10. When the vapor chamber 1 receives heat from the cooling object 100, the phase of the working fluid in a liquid phase, enclosed in the cavity 13, is changed from the liquid phase to a gas phase in the heat receiving part 15, and moves to the heat discharge part 16 of the vapor chamber 1 while flowing through the steam flow path 18. The working fluid in the gas phase moved from the heat receiving part 15 to the heat discharge part 16 discharges the latent heat at the heat discharge part 16, and the phase thereof is changed from the gas phase to the liquid phase. The latent heat discharged at the heat discharge part 16 is further discharged to the external environment of the vapor chamber 1. The working fluid whose phase is changed from the gas phase to the liquid phase in the heat discharge part 16 circulates from the heat discharge part 16 to the vicinity of the heat receiving part 15 in the first wick part 21 by the capillarity of the first wick part 21 of the wick structure 20. Since the flow path resistance to the working fluid of the first wick part 21 is relatively small, the working fluid whose phase is changed to the liquid phase can smoothly circulate from the heat discharge part 16 to the vicinity of the heat receiving part 15. The working fluid in the liquid phase, having circulated to the vicinity of the heat receiving part 15, circulates from the vicinity of the heat receiving part 15 to the heat receiving part 15 mainly by the capillarity of the second wick part 22 of the wick structure 20. Since the capillarity of the second wick part 22 is relatively large, the working fluid in the liquid phase circulates to the heat receiving part 15 reliably. Therefore, dry-out in the heat receiving part 15 can be prevented.

Next, a vapor chamber according to a second exemplary embodiment of the present disclosure will be described with reference to the drawings. Note that the vapor chamber according to the second exemplary embodiment is common to the vapor chamber according to the first exemplary embodiment in the main parts. Therefore, the components that are the same as those of the vapor chamber according to the first exemplary embodiment will be described using the same reference numerals.

In the vapor chamber 1 according to the first exemplary embodiment, the dimension in the width direction of the second wick part 22 is almost the same as the dimension in the width direction of the first wick part 21. Instead, as illustrated in FIGS. 4 to 6, in the vapor chamber 2 according to the second exemplary embodiment, the dimension in the width direction of the second wick part 22 is larger than the dimension in the width direction of the first wick part 21. Moreover, as illustrated in FIGS. 4 and 5, the shape of the first wick part 21 has a long length. Therefore, in the vapor chamber 2, the container 10 has a shape that the dimension in the width direction of the heat receiving part 15 is larger than the dimension in the width direction of the heat discharge part 16. Moreover, the heat discharge part 16 of the container 10 is in a shape having a long length.

Moreover, in the vapor chamber 1 according to the first exemplary embodiment, the one plate-shaped member 11 and the other plate-shaped member 12 facing the one plate-shaped member 11 overlap each other to thereby form the container 10. Instead, as illustrated in FIGS. 4 to 7, in the vapor chamber 2 according to the second exemplary embodiment, the container 10 is thicker than that of the vapor chamber 1 according to the first exemplary embodiment, and the dimension in the thickness direction of the cavity 13 is larger. Accordingly, an intermediate member 30 in a frame shape is further disposed between the one plate-shaped member 11 and the other plate-shaped member 12. The intermediate member 30 in a frame shape forms a side wall of the container 10.

In the vapor chamber 2, the second wick part 22 has a structure in which a second wick part 22-1 having a relatively smaller area and a second wick part 22-2 having a relatively larger area are layered. The second wick part 22-1 is disposed on the side of the one plate-shaped member 11, and the second wick part 22-2 is disposed on the side of the other plate-shaped member 12. The heat receiving part 15 of the one plate-shaped member 11 has, on the inner surface thereof, a throttling part 31 in a recessed shape. The shape and the dimension of the throttling part 31 in a plan view almost correspond to the shape and the dimension of the cooling object 100.

As illustrated in FIG. 6, in the second wick part 22, a portion of the second wick part 22-1 is inserted in the throttling part 31. On the other hand, the second wick part 22-2 is not inserted in the throttling part 31, and extends on the inner surface of the one plate-shaped member 11 from the throttling part 31 up to a region outside thereof. With the second wick part 22-2, the area of the second wick part 22 in a plan view is larger than the area of the cooling object 100 thermally connected to the heat receiving part 15 in a plan view. Accordingly, it is possible to allow a sufficient amount of working fluid in a liquid phase to circulate throughout the heat receiving part 15.

In the vapor chamber 2 in which the throttling part 31 is formed, the cooling object 100 can be thermally connected to the container 10 directly without having a heat receiving plate between the cooling object 100 and the container 10.

Further, in the vapor chamber 2, it is possible to attach a heat exchange means not illustrated (for example, a heat discharge fin in a plate shape) to the heat discharge part 16 whose dimension in the width direction is smaller than that of the heat receiving part 15, that is, thermally connect the heat exchange means to the heat discharge part 16, to form a heat sink. By providing a cooling fan (not illustrated) in the vicinity of the heat discharge part 16 attached with the heat exchange means and performing forced cooling by the cooling fan, it is possible to improve the heat exchange efficiency of the heat sink.

Next, another exemplary embodiment of the present disclosure will be described. In the vapor chamber according to the first exemplary embodiment, the first wick part is formed of one first wick member. However, it may be formed of a layered body of a plurality of first wick members. In the vapor chamber according to the first exemplary embodiment, the dimension in the width direction of the second wick part is almost the same as the dimension in the width direction of the first wick part 21. However, the size of the dimension in the width direction of the first wick part and the dimension in the width direction of the second wick part is not particularly limited. For example, the dimension in the width direction of the first wick part may be larger than the dimension in the width direction of the second wick part, and the dimension in the width direction of the second wick part may be larger than the dimension in the width direction of the first wick part. Further, in the vapor chamber according to the first exemplary embodiment, the shape of the container is a rectangular shape in a plan view. However, the shape of the container in a plan view is not limited particularly. For example, the shape may be a trapezoid shape, a polygonal shape of pentagon or more, a circular shape, or the like.

Moreover, in the exemplary embodiments described above, the second wick part is provided at one location corresponding to the fact that a cooling object is thermally connected to one location of the vapor chamber. However, in the case where cooling objects are thermally connected to a plurality of locations of the vapor chamber, second wick parts may be provided to the plurality of locations.

Moreover, in the vapor chamber according to the second exemplary embodiment, the dimension in the width direction of the second wick part is larger than the dimension in the width direction of the first wick part. However, the size of the dimension in the width direction of the first wick part and the dimension in the width direction of the second wick part is not particularly limited. For example, the dimension in the width direction of the second wick part may be the same as the dimension in the width direction of the first wick part.

A vapor chamber of the present disclosure is excellent in the mechanical strength, capable of preventing dry-out in the heat receiving part even if a cooling object having a large amount of heat generation is thermally connected, and is able to allow a working fluid in a liquid phase to smoothly circulate from the heat discharge part to the hear receiving part. Therefore, the vapor chamber is applicable in a wide range of fields. In particular, a vapor chamber of the present disclosure has a high utility value in the field of cooling a heating element having a large amount of heat generation to be installed in a narrow space, such as a central processing unit to be mounted on an electronic device such as a computer

What is claimed is:

1. A vapor chamber comprising:
    a container having a cavity that is hollow, the container being formed of a first plate and a second plate facing the first plate, the first plate and the second plate being layered on each other;
    a working fluid enclosed in the cavity; and
    a wick structure provided in the cavity, wherein
    the wick structure includes a first linear wick extending from a heat receiving section to a heat discharge section and a second linear wick provided to the heat receiving section,
    an average diameter of the second linear wick is smaller than an average diameter of the first linear wick, or an aperture dimension of the second linear wick is smaller than an aperture dimension of the first linear wick,
    the heat receiving section has a structure in which the first linear wick and the second linear wick are layered in an overlapping manner, and the heat discharge section has a structure in which only the first linear wick is disposed and the second linear wick is not disposed,
    a space between an inner surface of the second plate and a top surface of the wick structure forms a steam flow path through which the working fluid in a gas phase flows, and
    only the first linear wick extends all over the cavity along a planar direction of the container, so that only the first linear wick extends from the heat receiving section to the heat discharge section provided on the first plate of the container,
    in the heat receiving section having the structure in which the first linear wick and the second linear wick are layered in an overlapping manner, a dimension in a width direction of the second linear wick is not smaller than a dimension in the width direction of the first linear wick, only the second linear wick is located on a side to which a body to be cooled is thermally connected, the wick structure has a larger capillarity in an area located at the heat receiving section than in an area located at the heat discharge section,
    the second linear wick is disposed so as to entirely overlap the body to be cooled in a plan view, and
    only a portion of a top surface of the first linear wick is in contact with the inner surface of the second plate.

2. The vapor chamber according to claim 1, wherein a plurality of the linear members being the structure which forms the second linear wick are layered on each other to form the second linear wick.

3. The vapor chamber according to claim 2, wherein an area of the second linear wick in a plan view is larger by 2% or more and 60% or less than an area in a plan view of a body to be cooled that is thermally connected to the heat receiving section.

4. The vapor chamber according to claim 2, wherein the average diameter of the linear member being the structure which forms the second linear wick is smaller by 30% or more and 70% or less than the average diameter of the linear member being the structure which forms the first linear wick.

5. The vapor chamber according to claim 2, wherein the aperture dimension of the linear member being the structure which forms the second linear wick is smaller by 20% or more and 70% or less than the aperture dimension of the linear member being the structure which forms the first linear wick.

6. The vapor chamber according to claim 2, wherein each of the linear member being the structure which forms the first linear wick and the linear member being the structure which forms the second linear wick is a metal mesh.

7. The vapor chamber according to claim 1, wherein an area of the second linear wick in a plan view is larger by 2% or more and 60% or less than an area in a plan view of a body to be cooled that is thermally connected to the heat receiving section.

8. The vapor chamber according to claim 1, wherein the average diameter of the linear member being the structure which forms the second linear wick is smaller by 30% or more and 70% or less than the average diameter of the linear member being the structure which forms the first linear wick.

9. The vapor chamber according to claim 1, wherein the aperture dimension of the linear member being the structure which forms the second linear wick is smaller by 20% or more and 70% or less than the aperture dimension of the linear member being the structure which forms the first linear wick.

10. The vapor chamber according to claim 1, wherein each of the linear member being the structure which forms the first linear wick and the linear member being the structure which forms the second linear wick is a metal mesh.

* * * * *